United States Patent
Waterman et al.

(10) Patent No.: US 9,405,289 B2
(45) Date of Patent: Aug. 2, 2016

(54) METHOD AND APPARATUS FOR AUTONOMOUS IDENTIFICATION OF PARTICLE CONTAMINATION DUE TO ISOLATED PROCESS EVENTS AND SYSTEMATIC TRENDS

(71) Applicant: Tokyo Electron Limited, Tokyo (JP)

(72) Inventors: Aaron Archer Waterman, Mountain View, CA (US); Yuichiro Morozumi, Yamanashi (JP); Tetsushi Ozaki, Yamanashi (JP); Sanjeev Kaushal, San Jose, CA (US); Sukesh Janubhai Patel, Cupertino, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 631 days.

(21) Appl. No.: 13/706,712

(22) Filed: Dec. 6, 2012

(65) Prior Publication Data

US 2014/0163712 A1      Jun. 12, 2014

(51) Int. Cl.
| | |
|---|---|
| *G06F 17/40* | (2006.01) |
| *G05B 19/418* | (2006.01) |
| *H01L 21/67* | (2006.01) |
| *G06N 99/00* | (2010.01) |

(52) U.S. Cl.
CPC .... *G05B 19/41875* (2013.01); *H01L 21/67288* (2013.01); *G05B 2219/31336* (2013.01); *G05B 2219/32368* (2013.01); *G05B 2219/37224* (2013.01); *G06N 99/005* (2013.01)

(58) Field of Classification Search
None
See application file for complete search history.

(56) References Cited

U.S. PATENT DOCUMENTS

| | | |
|---|---|---|
| 2003/0047012 A1 | 3/2003 | Storbeck et al. |
| 2004/0093110 A1 | 5/2004 | Chong et al. |
| 2010/0249976 A1 | 9/2010 | Aharoni et al. |
| 2011/0284029 A1 | 11/2011 | Baseman et al. |
| 2012/0185813 A1 | 7/2012 | Kaushal et al. |

OTHER PUBLICATIONS

International Search Report and Written Opinion for PCT Patent Application No. PCT/US2013/059722, dated Feb. 26, 2014, 12 pages.

*Primary Examiner* — Kenneth M Lo
*Assistant Examiner* — Geoffrey Wellman
(74) *Attorney, Agent, or Firm* — Amin, Turocy & Watson, LLP

(57) ABSTRACT

A system and method for autonomously tracing a cause of particle contamination during semiconductor manufacture is provided. A contamination analysis system analyzes tool process logs together with particle contamination data for multiple process runs to determine a relationship between systematic particle contamination levels and one or more tool parameters. This relationship is used to predict expected contamination levels associated with regular usage of the tool, and to identify which tool parameters have the largest impact on expected levels of particle contamination. The contamination analysis system also identifies process logs showing unexpected deviant particle contamination levels that exceed expected contamination levels, and traces the cause of the deviant particle contamination to particular process log parameter events.

20 Claims, 15 Drawing Sheets

| CONTAMINATION SPECIFICATIONS | | | | ANALYSIS LEVEL | |
|---|---|---|---|---|---|
| ☑ Large Particle Count | 30 | AND ☐ | OR ☑ | LOT | ☐ |
| ☑ Medium Particle Count | 30 | AND ☐ | OR ☑ | RUN | ☑ |
| ☐ Small Particle Count | | AND ☐ | OR ☐ | STEP | ☐ |
| ☐ Total Particle Count | | AND ☐ | OR ☐ | | |

402 ← CONTAMINATION SPECIFICATIONS; 404 ← ANALYSIS LEVEL; 406 ← input fields; 400 ← overall

FIG. 4

| DETRIMENTAL CONTAMINATION LEVEL: 30 MEDIUM OR LARGE PARTICLES | | | |
|---|---|---|---|
| Tool Run | Small Particles | Medium Particles | Large Particles |
| 0 | 15 | 3 | 0 |
| 1 | 27 | 6 | 0 |
| 2 | 36 | 8 | 0 |
| 3 | 43 | 54 | 27 |
| ... | | | |
| N | 34 | 7 | 7 |

FIG. 5

| DETRIMENTAL CONTAMINATION LEVEL: 30 MEDIUM OR LARGE PARTICLES | | | | IDENTIFIED CRITICAL PARAMETER EVENT | | |
|---|---|---|---|---|---|---|
| Tool Run | Small Particles | Medium Particles | Large Particles | Parameter | Parameter Value | Recipe Step |
| 3 | 43 | 54 | 27 | Chamber 6 Pressure | 92 psi | Valve Opening |
| 27 | 53 | 28 | 45 | Chamber 8 Pressure | 96 psi | Valve Opening |

METHOD AND APPARATUS FOR AUTONOMOUS IDENTIFICATION OF PARTICLE CONTAMINATION DUE TO ISOLATED PROCESS EVENTS AND SYSTEMATIC TRENDS

TECHNICAL FIELD

The subject invention relates generally to techniques for tracing the cause of particle contamination during semiconductor manufacturing.

BACKGROUND

Progressive technological evolution of electronics and computing devices motivates advances in semiconductor technology. Growing consumer demand for smaller, higher performance, and more efficient computer devices and electronics has led to down-scaling of semiconductor devices. To meet device demand while restraining costs, silicon wafers upon which semiconductor devices are formed have increased in size.

Fabrication plants working with large wafer sizes utilize automation to implement and control wafer processing. Such plants can be capital intensive, and accordingly, it is desirable to maintain highly efficient operation of fabrication equipment to minimize downtime and maximize yields. To facilitate these goals, measurement equipment is often employed to monitor fabrication equipment during wafer processing and to acquire measurement information on both the equipment and the processed wafer. The measurement information can then be analyzed to optimize fabrication equipment.

According to an example, measurement information can include tool level information, which indicates a state or condition of fabrication equipment or a portion thereof, wafer metrology information specifying physical and/or geometric conditions of wafers being processed, electrical text information, and the like. In addition, spectroscopic data, e.g., spectral line intensity information, can be gathered to facilitate identification of etch endpoints by process engineers. However, in conventional fabrication environments, various measurement data is handled independently of one another, for different purposes. Accordingly, inter-relationships among various measurement data are not leveraged for advanced optimization of fabrication processes.

The above-described deficiencies of today's semiconductor fabrication measurement and optimization systems are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

The following presents a simplified summary in order to provide a basic and general understanding of some aspects of exemplary, non-limiting embodiments described herein. This summary is not an extensive overview nor is intended to identify key/critical elements or to delineate the scope of the various aspects described herein. Instead, the sole purpose of this summary is to present some concepts in a simplified form as a prelude to the more detailed description of various embodiments that follow.

One or more embodiments of the present disclosure relate to techniques for autonomously tracing the cause of particle contamination during semiconductor fabrication to a particular parameter event in the associated process log of a manufacturing tool. To this end, a contamination analysis system is provided that can identify expected contamination levels associated with regular usage of the tool, which tool parameters are most associated with the expected contamination levels, unexpected process log parameter events that are associated with detrimental levels of particle contamination, and other such information.

In one or more embodiments, the contamination analysis system accepts process log data corresponding to multiple process runs of a semiconductor manufacturing process. The analysis tool also allows a user to enter contamination specifications that define critical particle counts for one or more types of particles. Using this information, the contamination analysis system segregates process logs corresponding to runs showing significant particle contamination from process logs corresponding to normal process runs showing acceptable levels of particle contamination. A problem solving engine then processes the normal process logs (omitting the process logs corresponding to deviant runs) to identify tool parameters associated with acceptable, expected levels of particle contamination resulting from tool degradation and maintenance activities. Using this information, the analysis tool defines an expected particle contamination level as a function of the tool parameters, which provides useful information about the impact of maintenance on particle contamination and which can be used to separate systematic contamination trends from detrimental isolated events in the tool process logs.

In addition, the contamination analysis system can perform sensitivity analysis using the tool process logs corresponding to detrimental particle levels to determine which tool parameters display deviant behavior. Based on this sensitivity analysis, the contamination analysis system can rank tool parameters according to their impact on both normal and unexpected particle contamination, offering users an insight into the effects of respective tool parameters and process events on particle contamination.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 4 illustrates an exemplary interface for defining contamination specifications.

FIG. 5 illustrates identification of detrimental tool runs.

FIG. 11 illustrates an exemplary display output that lists deviant tool runs together with their respective identified root cause parameter events.

DETAILED DESCRIPTION

Figure 1:
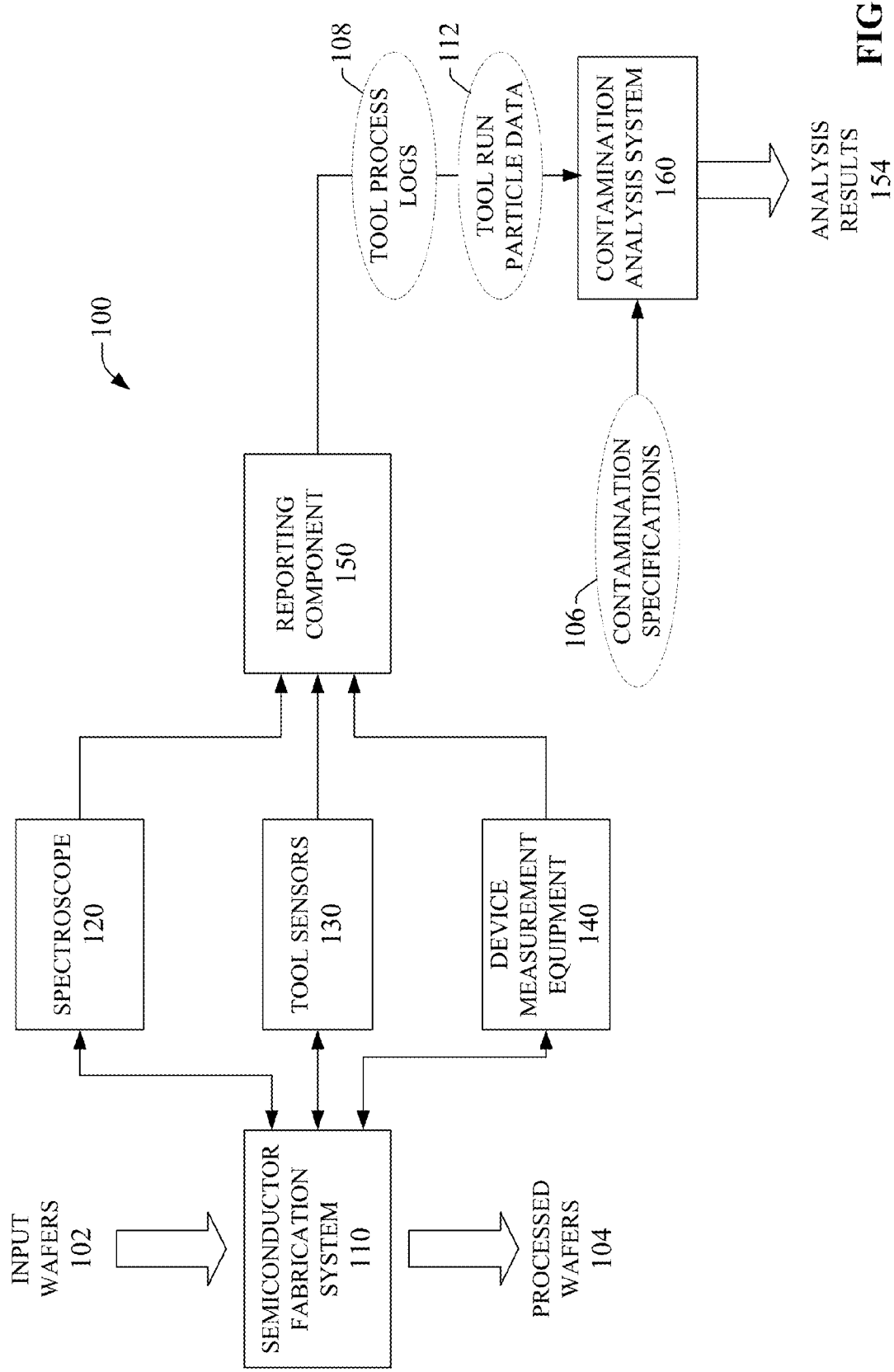
FIG. 1 is block diagram illustrating an exemplary system for collecting and analyzing information relating to semiconductor production.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present innovation.

As used in the subject specification and drawings, the terms "object," "module," "interface," "component," "system," "platform," "engine," "selector," "manager," "unit," "store," "network," "generator" and the like are intended to refer to a computer-related entity or an entity related to, or that is part of, an operational machine or apparatus with a specific functionality; such entities can be either hardware, a combination of hardware and firmware, firmware, a combination of hardware and software, software, or software in execution. In addition, entity(ies) identified through the foregoing terms are herein generically referred to as "functional elements." As an example, a component can be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer-readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As an example, a component can be an apparatus with specific functionality provided by mechanical parts operated by electric or electronic circuitry, which is operated by software, or firmware application executed by a processor, wherein the processor can be internal or external to the apparatus and executes at least a part of the software or firmware application. As another example, a component can be an apparatus that provides specific functionality through electronic components without mechanical parts, the electronic components can include a processor therein to execute software or firmware that confers at least in part the functionality of the electronic components. Interface (s) can include input/output (I/O) components as well as associated processor(s), application(s), or API (Application Program Interface) component(s). While examples presented hereinabove are directed to a component, the exemplified features or aspects also apply to object, module, interface, system, platform, engine, selector, manager, unit, store, network, and the like.

Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the term "set" as employed herein excludes the empty set; e.g., the set with no elements therein. Thus, a "set" in the subject disclosure includes one or more elements or entities. As an illustration, a set of components includes one or more components; a set of variables includes one or more variables; etc.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

FIG. 1 is block diagram illustrating an exemplary system 100 for collecting and analyzing information relating to semiconductor production. As shown in FIG. 1, a semiconductor fabrication system 110 can receive input wafers 102 and output processed wafers 104. In an exemplary, non-limiting embodiment, semiconductor fabrication system 110 can be an etch tool that removes unmasked material from input wafers 102 via an etching process (e.g., wet etch, dry etch, plasma etching, etc.) to generate processed wafers 104 having cavities and features formed thereon. Semiconductor fabrication system 110 can also be a deposition tool that deposits material onto input wafers 102 to yield processed wafers 104.

A variety of measurement devices, such as spectroscope 120, tool sensors 130, and device measurement equipment 140, can monitor the process performed by semiconductor fabrication system 110 to acquire disparate information relating to various aspects, conditions, or results of the process. As an example, spectroscope 120 can acquire spectral intensity information which includes a set of intensities for respective wavelengths or spectral lines observable by spectroscope 120. Spectral intensity information can be time-series data such that spectroscope 120 measures intensities for respective wavelengths at regular intervals (e.g., every second, every 2 seconds, every 100 milliseconds, etc.). Spectroscope 120 can also correlate spectral intensity information with wafer IDs associated with specific wafers processed by semiconductor fabrication system 110. Accordingly, spectroscope 120 can acquire spectral intensity information individually for each wafer processed by semiconductor fabrication system 110.

Tool sensors 130 can monitor and measure tool operation characteristics while semiconductor fabrication system 110 processes input wafers 102 and generate corresponding sensor information. Tool sensor information, similar to spectral intensity information measured by spectroscope 120, can be time-series data correlated on a per-wafer basis. Tool sensor information can include measurements from a variety of sensors. Such measurements can include, but are not limited to, pressures within one or more chambers of semiconductor fabrication system 110, gas flows for one or more distinct gases, temperatures, upper radio frequency (RF) power, elapsed time since last wet-clean, age of tool parts, and the like.

Device measurement equipment 140 can measure physical and geometric properties of wafers and/or features fabricated on wafers. For instance, device measurement equipment 140 can measure development inspection critical dimension (DI-CD), final inspection critical dimension (FI-CD), etch bias, thickness, and so forth, at predetermined locations or regions of wafers. The measured properties can be aggregated on a per-location, per-wafer basis and output as device measurement information. Properties of wafers are typically measured before processing or after processing. Accordingly, device measurement information is typically time-series data acquired at a different interval as compared with spectral intensity information and tool sensor information.

During fabrication, semiconductor wafers are susceptible to particle contamination, or introduction of undesirable materials into the wafer material. Particle contamination is often a result of imperfections in the fabrication process, such as unclean or worn tools, tool failures, excessive vibration, gas impurities, unexpected irregularities in the fabrication process, or other factors. For example, contaminants in the chemicals used in the fabrication process—e.g., photoresists, acids, solvents, bases, etc.—can lead to particle contamination of the resulting semiconductor. While low levels of particle contamination do not substantially hinder operation of the semiconductor, excessive levels of particle contamination can negatively impact reliability or lead to premature failure of the semiconductor.

Given the large number of process variables involved in semiconductor manufacture (tool parameters, tool age, recipe parameters, environmental conditions at each step of the recipe, etc.), tracing a root cause process event or condition affecting contamination levels can be difficult. For instance, a certain expected amount of particle contamination is a result of tool wear (which itself is a function of tool age). As such, a percentage of overall particle contamination is a function of regular and expected tool usage. However, since tool measurement data is not typically correlated with contamination measurements, it is difficult to assess which tool parameters have the highest impact on these systematic levels of contamination. This information would be useful to equipment owners in connection with identifying where maintenance efforts should be focused.

Moreover, the problem of identifying critical process parameters affecting particle contamination levels is rendered more difficult by occurrence of unexpected process events or conditions that can also introduce undesirable substances into the wafer. For example, unexpected gas exhaust backflow in a chamber of semiconductor fabrication system 110 during a particular step in the fabrication process can result in increased levels of particle contamination for the wafer being processed at the time. Particle contamination levels for wafers that experience such unexpected process events are therefore outliers that deviate from the expected, systematic levels of particle contamination associated with normal tool usage. These unexpected deviations complicate the problem of identifying sources of normal or unexpected particle contamination.

To address these issues, a contamination analysis system 160 is provided that leverages tool process log data and particle contamination data to autonomously identify causes of particle contamination, forecast expected levels of contamination due to normal operation of the semiconductor fabrication system 110, and other functions to be described in more detail below. In one or more embodiments, contamination analysis system 160 can receive, as input, tool process logs 108 and tool run particle data 112. Tool process logs 108 comprise measured parameter and performance data measured during respective runs of semiconductor fabrication system 110. Tool process logs 108 can include measurement data from one or more of the spectroscope 120, tool sensors 130, or device measurement equipment 140. Measurements recorded in tool process logs 108 can include, but are not limited to, sensor readings (e.g., process log data such as chamber pressures, gas flows, temperatures, power, etc.), maintenance related readings (e.g., age of parts, time since last performed maintenance, time since last batch of resist was loaded, etc.), spectroscopy data (e.g., measured intensity at different wavelengths), and/or tool and performance statistics (e.g., time to process wafer, chemical consumption, gas consumption, etc.). In an exemplary scenario, a tool process log can be generated by a reporting component 150 at the end of each process run of semiconductor fabrication system 110. At the end of a process run, data from one or more of the spectroscope 120, tool sensors 130, or device measurement equipment 140 can be provided to reporting component 150, which aggregates the collected data in a tool process log for the run. A tool process log can correspond to a single semiconductor wafer processed during the run, or a batch of semiconductors fabricated during the run. Tool process logs 108 can then be stored for reporting or archival purposes. Tool process logs 108 can be provided to contamination analysis system 160 either manually by an operator or automatically by reporting component 150 or a related device.

Tool run particle data 112 represents particle contamination levels measured for a wafer or a batch of wafers during a given run. These contamination levels are typically provided in the form of estimated particle counts for each of a variety of particle sizes detected in the wafer. In some systems, the particle counts represent an average number of particles measured during processing of semiconductor material. Tool run particle data 112 can be gathered by any suitable inspection instrumentation, including but not limited to optical or scanning electron microscopes, laser surface scanning equipment, or the like. Similar to tool process logs 108, tool run particle data 112 can be provided directly to contamination analysis system 160 by reporting component 150 or a relate device, or entered manually into contamination analysis system 160 by an operator.

Contamination analysis system 160 processes tool process logs 108 and tool run particle data 112 in view of contamination specifications 106 defined by the user. Contamination specifications 106 define a metrology data output to be used for analysis, in the form of specified detrimental particle counts for one or more types of particles. Contamination specifications 106 are used by contamination analysis system 160 to distinguish between acceptable contamination levels and detrimental contamination levels. Contamination analysis system 160 analyzes tool process logs 108 and tool run particle data 112 in view of contamination specifications 106 to generate analysis results 154, to be described in more detail below. In general, analysis results 154 assist in identifying (a) expected particle contamination levels associated with regular usage of a fabrication tool (e.g., a deposition or etching tool), (b) which tool parameters are most associated with the expected levels of particle contamination, and (c) unexpected process log parameter events associated with detrimental levels of particle contamination.

Figure 2:
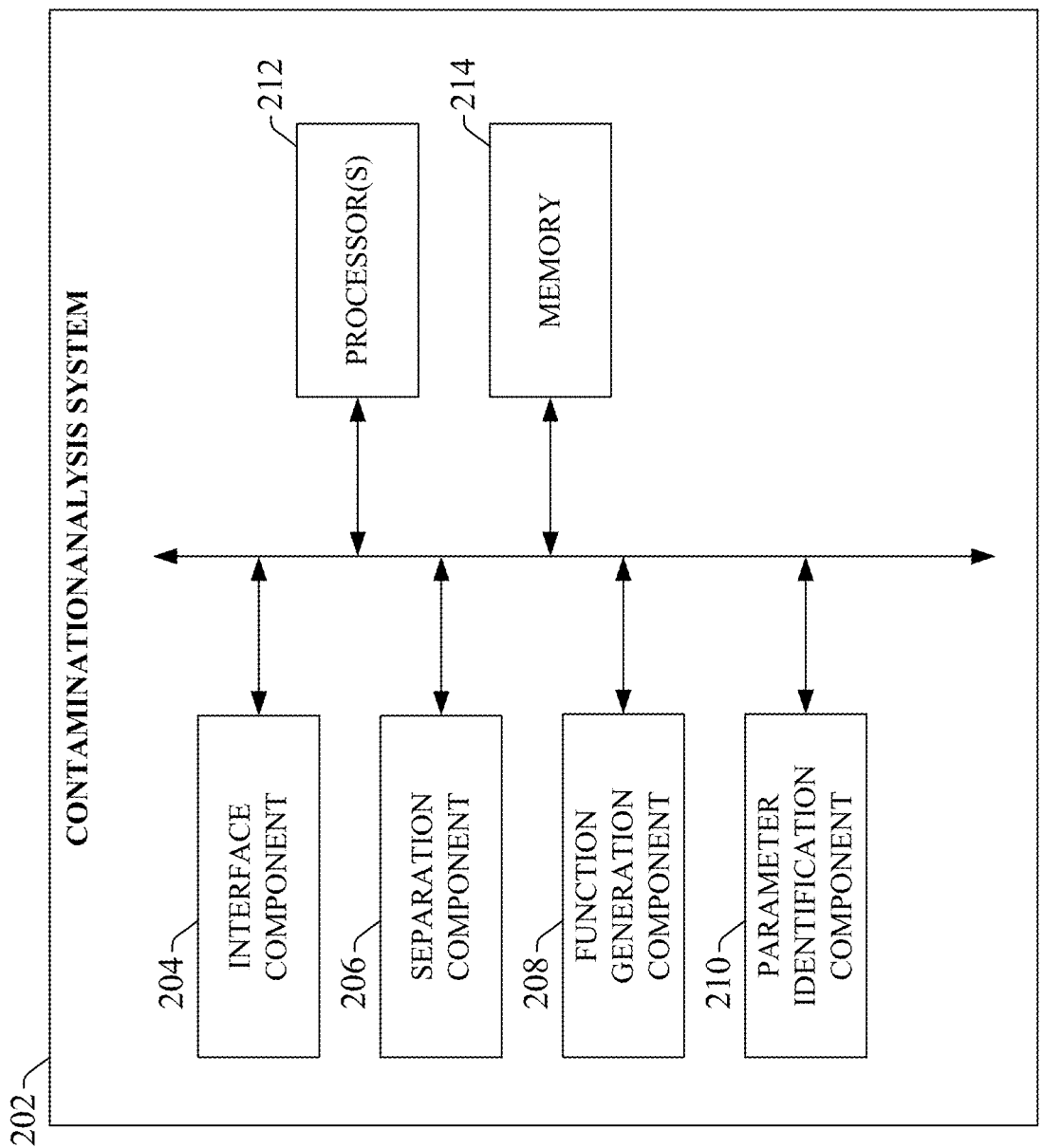
FIG. 2 is a block diagram of an exemplary contamination analysis system that correlates tool parameters and process events with normal or unexpected levels of particle contamination.

FIG. 2 is a block diagram of an exemplary contamination analysis system that can correlate tool parameters and process events with normal or unexpected levels of particle contamination. Aspects of the systems, apparatuses, or processes explained in this disclosure can constitute machine-executable components embodied within machine(s), e.g., embodied in one or more computer-readable mediums (or media) associated with one or more machines. Such components, when executed by one or more machines, e.g., computer(s), computing device(s), automation device(s), virtual machine (s), etc., can cause the machine(s) to perform the operations described.

Contamination analysis system 202 can include an interface component 204, a separation component 206, a function generation component 208, a parameter identification component 210, one or more processors 212, and memory 214. In various embodiments, one or more of the interface component 204, separation component 206, function generation component 208, parameter identification component 210, one or more processors 212, and memory 214 can be electrically and/or communicatively coupled to one another to perform one or more of the functions of the contamination analysis system 202. In some embodiments, components 204, 206, 208, and 210 can comprise software instructions stored on memory 214 and executed by processor(s) 212. The contamination analysis system 202 may also interact with other hardware and/or software components not depicted in FIG. 2. For example, processor(s) 212 may interact with one or more external user interface devices, such as a keyboard, a mouse, a display monitor, a touchscreen, or other such interface devices.

Interface component 204 can be configured to receive input from and provide output to a user of contamination analysis system 202. For example, interface component 204 can render an input display screen to a user that prompts for contamination specification definitions, and accepts such definitions from the user via any suitable input mechanism (e.g., keyboard, touch screen, etc.). Separation component 206 can be configured to segregate tool process logs showing acceptable contamination levels from those showing detrimental levels of particle contamination, as defined by contamination specifications provided by the user. Function generation component 208 can be configured to analyze tool process logs and tool run particle data to generate an output defining a level of particle contamination as a function of a set of tool parameters. Function generation component 208 can also be configured to generate functions that isolate the effects of each individual detrimental process run to determine the impact of unexpected events on particle contamination. Parameter identification component 210 can be configured to leverage the functions generated by function generation component 208 to identify tool parameters having the most influence on particle contamination, as well as their relative impact on contamination levels. Parameter identification component 210 can also identify unexpected process log parameter events that cause isolated particle contamination conditions. The one or more processors 212 can perform one or more of the functions described herein with reference to the systems and/or methods disclosed. Memory 214 can be a computer-readable storage medium storing computer-executable instructions and/or information for performing the functions described herein with reference to the systems and/or methods disclosed.

Figure 3:
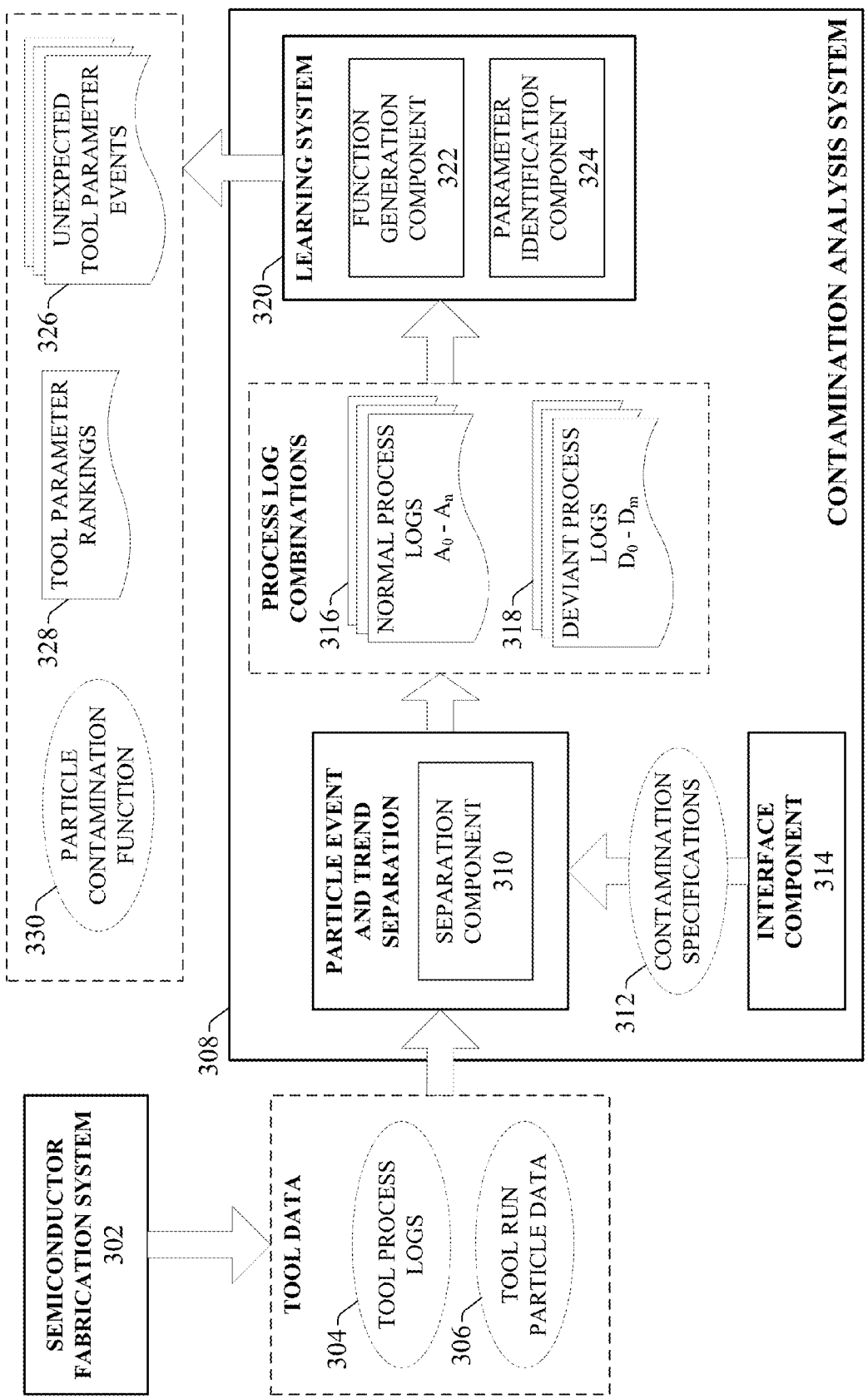
FIG. 3 is a block diagram illustrating processing functions performed by an exemplary contamination analysis system.

FIG. 3 is a block diagram illustrating processing functions performed by an exemplary contamination analysis system. As described above in connection with FIG. 1, contamination analysis system 308 receives, as input, tool process logs 304 and tool run particle data 306 associated with one or more runs of semiconductor fabrication system 302. Tool process logs 304 and tool run particle data 306 can be provided automatically to contamination analysis system 308 (e.g., by reporting component 150 of FIG. 1) or provided to the system manually by a user via interface component 314.

In addition to tool process logs 304 and tool run particle data 306, contamination analysis system 308 also receives contamination specifications 312 from a user via interface component 314. Contamination specifications 312 define a level of particle contamination considered to be detrimental, and can be defined in terms of one or more different particle types or metrologies. An exemplary interface for defining contamination specifications 312 is described in connection with FIG. 4. Exemplary interface 400 can be rendered to a user via interface component 314. As depicted in FIG. 4, a first interface section 402 is configured to receive contamination level definitions for one or more particle types. First interface section 402 allows a user to select one or more of large particles, medium particles, small particles, or total particles as factors for determining whether a wafer contains detrimental levels of contamination. Selecting a check box next to the particle type enables entry of an upper limit particle count in the designated data field 406. AND and OR checkboxes to the right of data fields 406 allow a user to specify whether the respective particle counts are to be treated as OR conditions (e.g., sufficient conditions for flagging a process log as detrimental regardless of the particle counts of other particle types) or AND conditions (e.g., one of multiple particle count conditions that must be met before a process log is flagged as detrimental). A second interface section 404 allows a user to define the level or granularity of analysis—lot, run, or step—that will be applied by the contamination analysis system. In the present example, the detrimental contamination condition is defined as a process run having 30 medium particles or 30 large particles. These contamination specifications are referenced by the contamination analysis system to separate detrimental tool process runs from normal tool process runs, as will be described in more detail below.

Returning now to FIG. 3, processing operations performed on tool process logs 304, tool run particle data 306, and contamination specifications 312 are described. After tool process logs 304, tool run particle data 306, and contamination specifications 312 are provided to contamination analysis system 308, separation component 310 performs particle event and trend separation on the tool process logs 304 based on the tool run particle data 306 and contamination specifications 312, resulting in a segregation of tool process logs 304 between normal process logs 316 and deviant process logs 318, where each process log corresponds to a particular tool run of semiconductor fabrication system 302. Identification of deviant tool runs is illustrated in FIG. 5. As depicted in FIG. 5, the contamination specifications used to identify deviant runs are those described above in connection with exemplary interface 400 of FIG. 4; namely, 30 medium or large particles. Accordingly, for a series of N tool runs (where N is an integer), tool run #3 is flagged as a deviant run, since 54 medium particles were measured for that run, exceeding the specification limit of 30 medium particles. Other tool runs having medium or large particle counts exceeding 30 will similarly be flagged by separation component 310.

Returning now to FIG. 3, based on identification of deviant tool runs as described above, separation component 310 segregates tool process logs 304 into two groups—normal process logs 316 associated with tool runs having normal levels of particle contamination (tool runs $A_0$-$A_n$), and deviant process logs 318 associated with tool runs having particle containment levels that exceed the defined contamination specifications 312 (tool runs $D_0$-$D_m$). This segregation process separates data associated with normal, expected contamination trends from data associated with unexpected process events that caused detrimental contamination levels outside the systematic trend.

The segregated process logs are provided to a learning system 320 comprising function generation component 322 and parameter identification component 324. Learning system 320 can process the segregated process logs in a number of ways to generate useful information regarding the effects of various tool parameters on normal contamination levels, identification of tool parameter events that cause unexpected levels of particle contamination, and other such information. For example, function generation component 322 can analyze normal process logs 316 to generate a particle contamination function 330 that describes normal, expected contamination levels as a function of various tool parameters of semiconductor fabrication system 302 (e.g., as a result of tool wear-and-tear and maintenance activities). Parameter identification component 324 can leverage particle contamination function 330 to generate tool parameter rankings 328 that rank tool parameters according to their respective impact on normal contamination levels, providing users with a tool for developing maintenance strategies for minimizing particle contamination. Learning system 320 can also perform sensitivity analysis on normal process logs 316 and deviant process logs 318 to identify unexpected tool parameter events 326 that result in detrimental levels of particle contamination not predicted by particle contamination function 330. These processing functions are described in more detail below.

Figure 6:
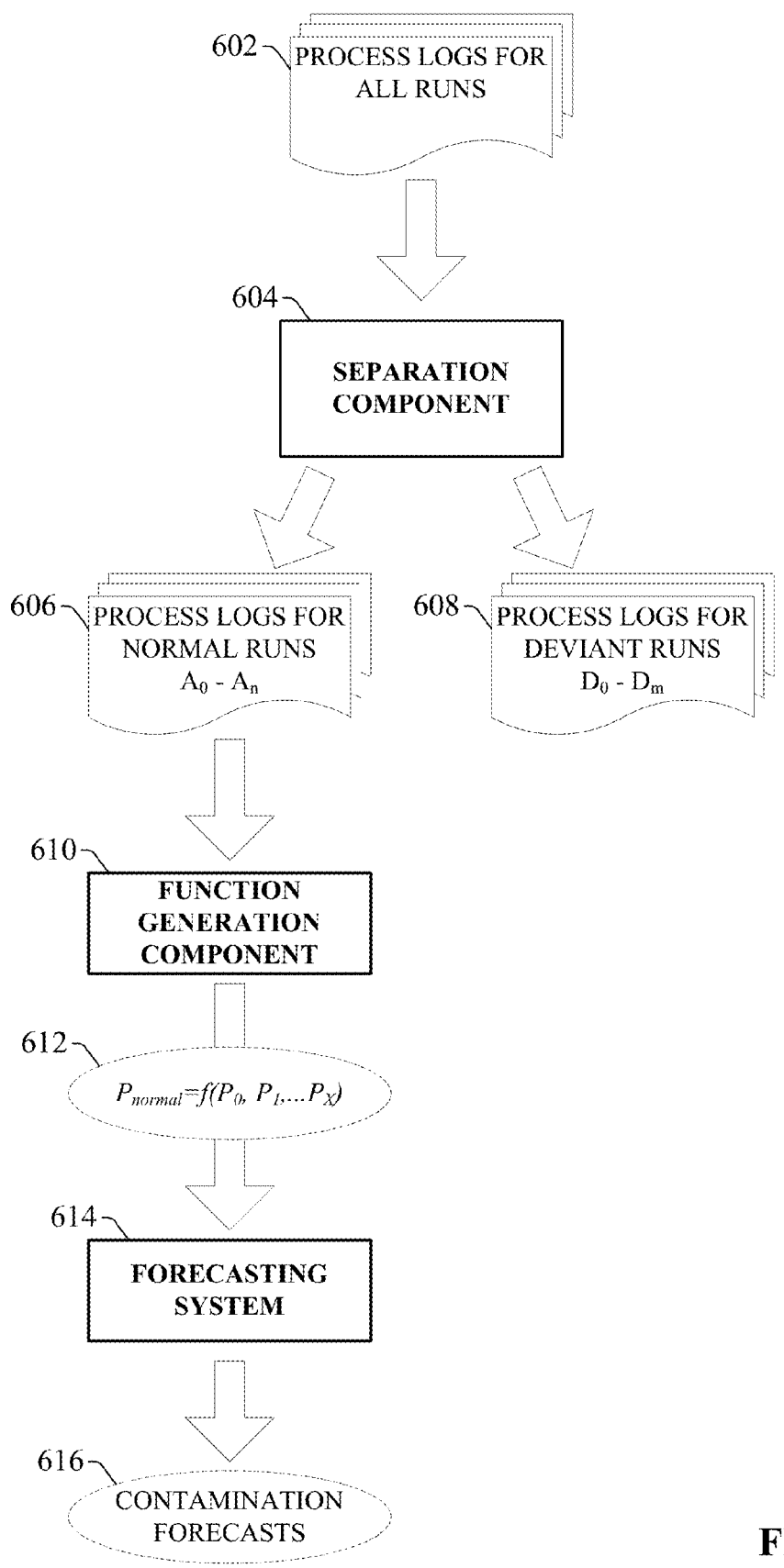
FIG. 6 illustrates an exemplary process flow for determining particle contamination levels for a semiconductor fabrication system as a function of one or more tool parameters.

FIG. 6 illustrates an exemplary process flow for determining particle contamination levels for a semiconductor fabrication system as a function of one or more tool parameters. As described above in connection with FIG. 3, separation component 604 (similar to separation components 206 or 310 of FIGS. 2 and 3, respectively) receives tool process logs 602 for a set of tool runs of a semiconductor fabrication system. Tool process logs 602 include values of X tool parameters ($P_0$-$P_x$) measured during the respective tool runs (e.g., by tool sensors 130 of FIG. 1). Exemplary tool parameters $P_0$-$P_x$ include, but are not limited to, tool maintenance data (e.g., age of parts, time since last maintenance, etc.), sensor measurements (e.g., chamber pressures, gas flows, upper RF power, RF-hours, etc.), and spectroscopy data. Each of the tool process logs 602 can correspond to a given tool run association with a single wafer ID or a batch ID. Tool process logs 602 can comprise parameter values for each tool parameter $P_0$-$P_x$ averaged over the entire process run. Alternatively, tool process logs 602 can include higher granularity tool parameter data, e.g., values for tool parameters $P_0$-$P_x$ for each step of a recipe executed by the process run.

Based on contamination specifications provided by the user and tool run particle data for the respective tool runs, separation component 604 segregates tool process logs 602 into process logs for normal runs 606 and process logs for deviant runs 608, as described above in connection with FIGS. 3-5. With the process logs for deviant runs 608 removed from consideration, function generation component 610 (similar to function generation component 322 of FIG. 3) analyzes the process logs for normal runs 606 to determine a mathematical relationship between level of particle contamination $P_{normal}$ and tool parameters $P_0$-$P_x$. That is, based on an analysis of process logs for normal runs 606 and the associated particle contamination levels for the corresponding runs, function generation component 610 generates the following output:

$$P_{normal}=f(P_0,P_1,P_2 \ldots P_x) \text{ for runs } A_0 \text{ through } A_n \quad (1)$$

where $P_{normal}$ is a level of particle contamination (e.g., a particle count), and f is a function of tool parameters $P_0$-$P_x$ based on analysis of normal tool runs $A_0$ through $A_n$. Function generation component 610 can calculate the relationship described by equation (1) using any suitable problem solving methodology, including but not limited to symbolic regression, simulated annealing, neural networks, least squares fit, or multi-level regression. Function generation component 610 can then generate an output 612 based on the resulting function that characterizes the relationship between tool parameters $P_0$-$P_x$ for normal tool runs and systematic contamination level $P_{normal}$ for the particular metrology defined by the contamination specifications.

Equation (1) provides a means to identify tool parameters that are associated with normal, expected levels of particle contamination due to such factors as tool age and maintenance activities. The function $P_{normal}$ can provide useful information about the impact of tool maintenance on particle contamination, as well as provide a meaningful baseline signal that can be used to separate systematic contamination trends from isolated contamination events that are sometimes encountered during fabrication and recorded in the tool process logs. In some applications, output 612 can also be provided to a forecasting system 614, which can leverage the calculated function for $P_{normal}$ to generate long-term contamination forecasts 616.

Figure 7:
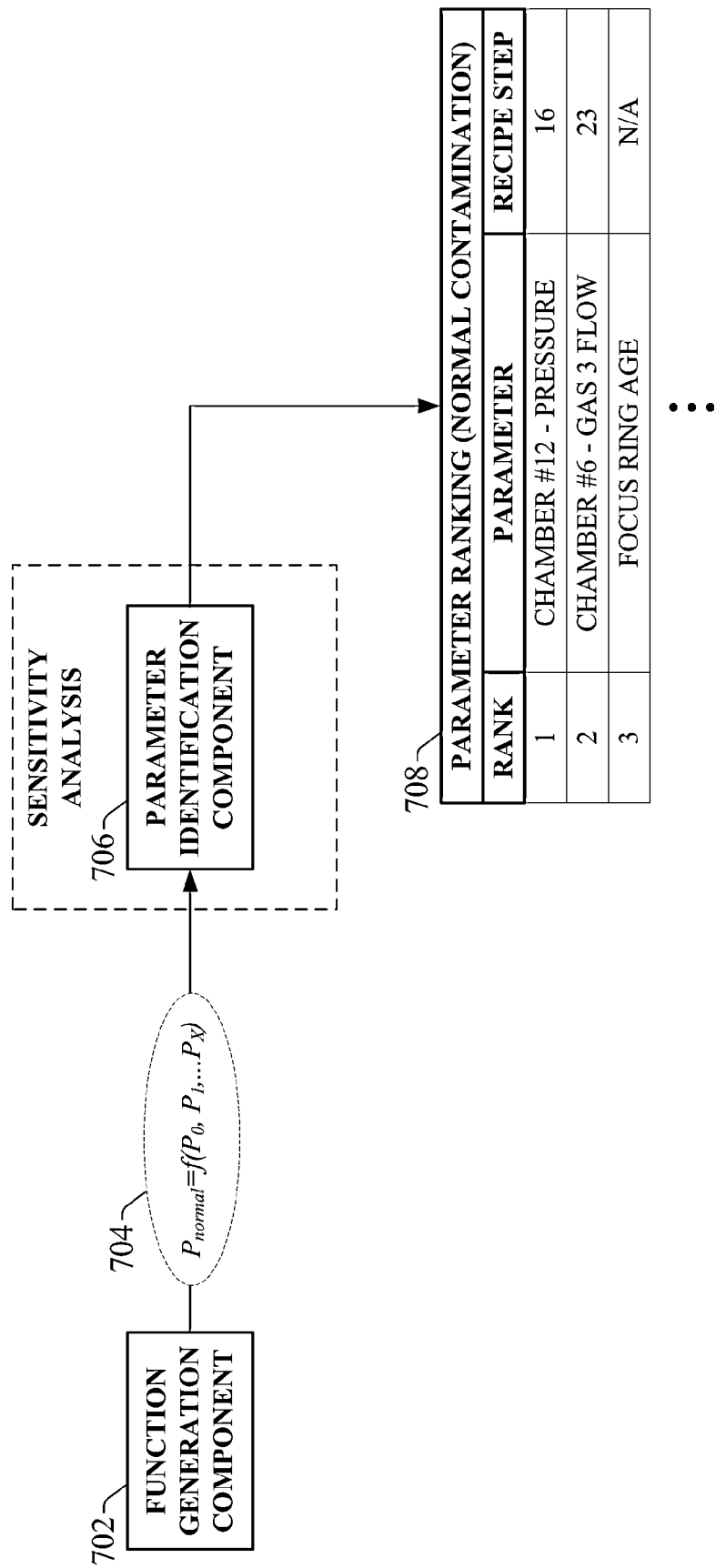
FIG. 7 illustrates ranking and identification of tool parameters that impact particle contamination levels.

Based on the $P_{normal}$ function of equation (1), the contamination analysis system described herein can identify which tool parameters have the highest impact on normal particle contamination levels, as illustrated in FIG. 7. Function generation component 702 (similar to function generation component 322 or 610) generates function 704 defining expected particle contamination level $P_{normal}$ as a function of tool parameters $P_0$-$P_x$, as described above, based on tool process logs for normal tool runs $A_0$-$A_n$. Parameter identification component 706 can then perform sensitivity analysis on function 704 to determine a parameter ranking 708, in which tool parameters $P_0$-$P_x$ are ranked according to their respective influence on particle contamination levels. An exemplary output for parameter ranking 708 can list all or a subset of tool parameters $P_0$-$P_x$ in descending order of their effect on particle contamination level $P_{normal}$.

As noted above, embodiments of the contamination analysis system described herein can calculate function $P_{normal}$ based on tool process logs comprising averaged or aggregated values for each tool parameter over the course of a given process run. However, it is recognized that sudden short-duration events can contribute to detrimental particle contamination. Accordingly, one or more embodiments of the contamination analysis system described herein can also consider each step of the tool recipe separately in order to reduce the potential for an outlier to be lost because of data aggregations. Accordingly, if analysis is performed at the recipe step level, parameter ranking 708 can also specify the recipe step associated with each parameter. For example, in the exemplary parameter ranking 708 illustrated in FIG. 7, the tool parameter identified as having the most influence on contamination level is the chamber #12 pressure measured at step 16 of the recipe. The tool parameter ranked as third-most influential on contamination levels is focus ring age, which is represented by a usage count that increments at the conclusion of each process run, and is therefore not associated with a particular recipe step.

Contamination level function 704 and parameter ranking 708 provide useful insight into the causes of normal, expected levels of particle contamination; e.g., factors such as tool age and degradation that result in gradual increase in particle contamination over time until maintenance or replacement is performed on the tool. This information can provide guidance as to where maintenance efforts should be focused in order to control contamination levels while minimizing maintenance downtime. Particle contamination function 704 can also be leveraged to forecast future levels of particle contamination (e.g., by providing function 704 to a forecasting system 614). By removing tool process logs showing deviant levels of particle contamination from consideration prior to generating particle contamination function 704, one or more embodiments of the contamination analysis system described herein can separate systematic contamination trends from isolated, unexpected contamination events, resulting in a more accurate characterization of normal contamination level trends for a given semiconductor fabrication system.

Figure 8:
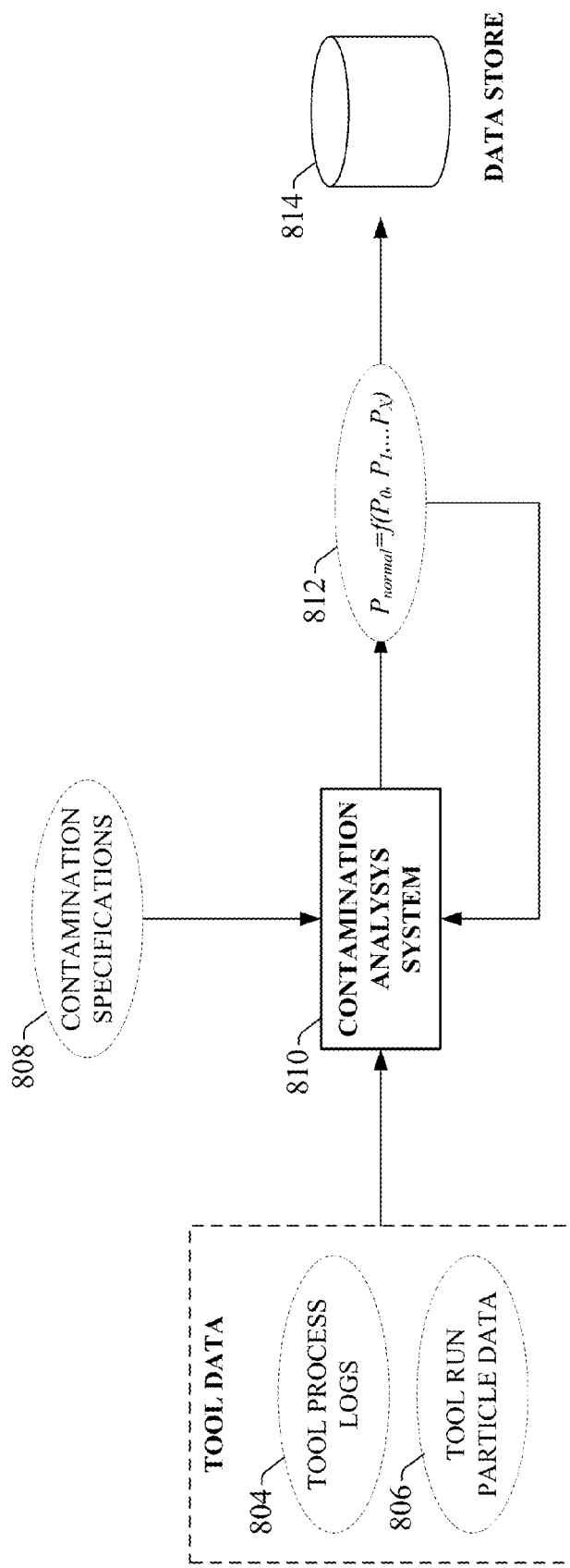
FIG. 8 illustrates an iterative process for deriving a function for systematic particle contamination as a function of tool process parameters.

In some scenarios, the contamination analysis system may perform a one-time, on-demand calculation of particle contamination function $P_{normal}$ and/or parameter rankings for a given set of tool process logs provided to the system (e.g., a set of tool run data provided to the system by a user). However, some embodiments of the contamination analysis system may also be configured to operate in a continuous iterative manner as new tool data is collected on a substantially real-time basis. This iterative processing is illustrated in FIG. 8. Contamination analysis system 810 (similar to contamination analysis systems 202 or 308) may be configured to receive tool process logs 804 and tool run particle data 806 directly from a semiconductor fabrication system as the new data becomes available (e.g., at the end of each tool run), and update particle contamination function 812 in view of contamination specifications 808. Particle contamination function 812 can be maintained in a data store 814 and used as a continuously updated historical baseline for predicting future contamination levels, identifying tool parameters having the most significant impact on particle contamination, and identifying unexpected tool parameter events that cause sudden increases in particle contamination deviating from expected levels. Since particle contamination function 812 characterizes expected contamination trends as a function of tool parameters $P_0$-$P_x$, tool process logs 804 having deviant contamination levels outside the acceptable range will be separated out (e.g., by separation component 310) and particle contamination function 812 will not be recalculated when such deviant tool process logs are received. In addition to recalculating particle contamination function 812, contamination analysis system 810 can also re-estimate the associated tool parameter rankings as new (non-deviant) tool data is received by.

The techniques described above can facilitate characterization of a fabrication system's normal, systematic contamination trends as a function of tool parameters. In addition, one or more embodiments of the contamination analysis system described herein can analyze tool process logs of deviant runs (e.g., deviant process logs 318) to learn which tool parameters display unexpected behavior resulting in sudden jumps in contamination levels. To this end, the contamination analysis system can assess each of the tool process logs associated with deviant process runs $D_0$-$D_m$ in view of the normal contamination trends characterized by $P_{normal}$ in order to identify one or more errant tool parameters that are the root cause of each detrimental run $D_0$-$D_m$.

Figure 9:
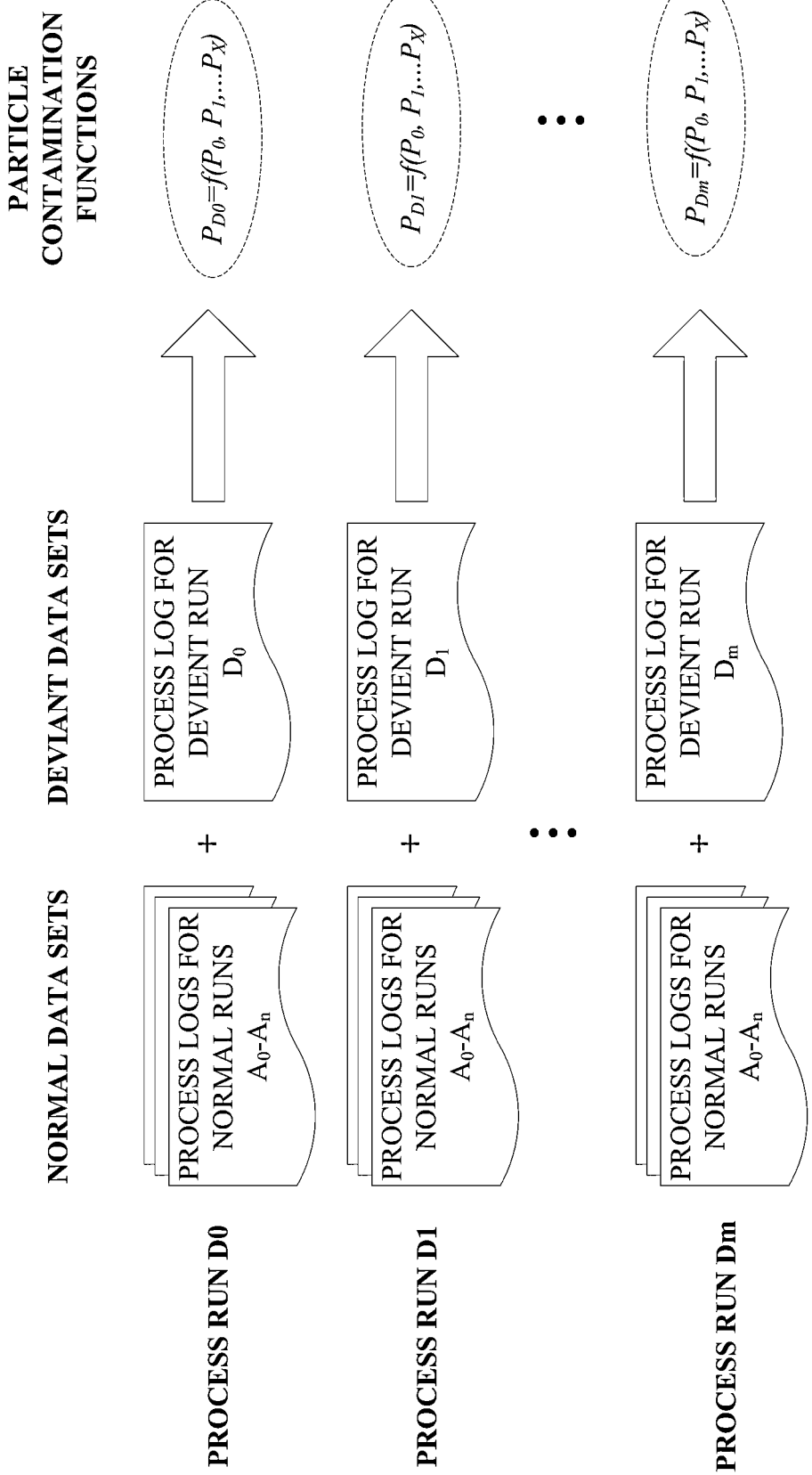
FIG. 9 illustrates derivation of particle contamination functions that isolate process events that cause unacceptable contamination levels.

This analysis is described in more detail with reference to FIGS. 6 and 9. As described above, separation component 604 receives tool process logs 304 and tool run particle data 306 for a set of process runs of a semiconductor fabrication system, and segregates normal process logs 316 for normal runs $A_0$-$A_n$ showing normal levels of contamination from deviant process logs 318 for process runs $D_0$-$D_m$ showing unexpected levels of particle contamination (based on metrology data defined in contamination specifications 312). The process logs for normal runs $A_0$-$A_n$ are then used to determine the function $P_{normal}$ characterizing the relationship between tool parameters $P_0$-$P_x$ and expected particle contamination levels. In order to identify unexpected tool parameter events responsible for each deviant run $D_0$-$D_m$, function generation component 322 generates a new particle contamination function for each deviant run based on a data set comprising data from the process logs for normal runs $A_0$-$A_n$ plus data from a process log of one deviant run of the set of deviant runs $D_0$-$D_m$. The first row of FIG. 9 illustrates this process for deviant process run $D_0$. Process logs for normal runs $A_0$-$A_n$ are combined with the process log for deviant run $D_0$ to yield a new data set. Function generation component (e.g., function generation components 208, 322, or 610 described above) then generates a particle contamination function $P_{D0}$ characterizing particle contamination (e.g., particle count) in terms of tool parameters $P_0$-$P_x$ based on the data set comprising the process logs for the normal runs $A_0$-$A_n$ plus the process log for deviant run $D_0$. Function $P_{D0}$ can be derived using similar techniques to those used to derive $P_{normal}$. In similar fashion, the function generation component generates new particle contamination functions for each of the m deviant process runs:

$$P_{D0}=f(P_0,P_1,P_2 \ldots P_x) \text{ for runs } A_0 \text{ through } A_n \text{ and } D_0 \quad (2)$$

$$P_{D1}=f(P_0,P_1,P_2 \ldots P_x) \text{ for runs } A_0 \text{ through } A_n \text{ and } D_1 \quad (3)$$

$$P_{D2}=f(P_0,P_1,P_2 \ldots P_x) \text{ for runs } A_0 \text{ through } A_n \text{ and } D_2 \quad (4)$$

$$\ldots$$

$$P_{Dm}=f(P_0,P_1,P_2 \ldots P_x) \text{ for runs } A_0 \text{ through } A_n \text{ and } D_m \quad (5)$$

This technique for treating each deviant process log individually can isolate unexpected tool parameter behavior and reduce complexity of identifying errant tool parameters in the process logs.

Figure 10:
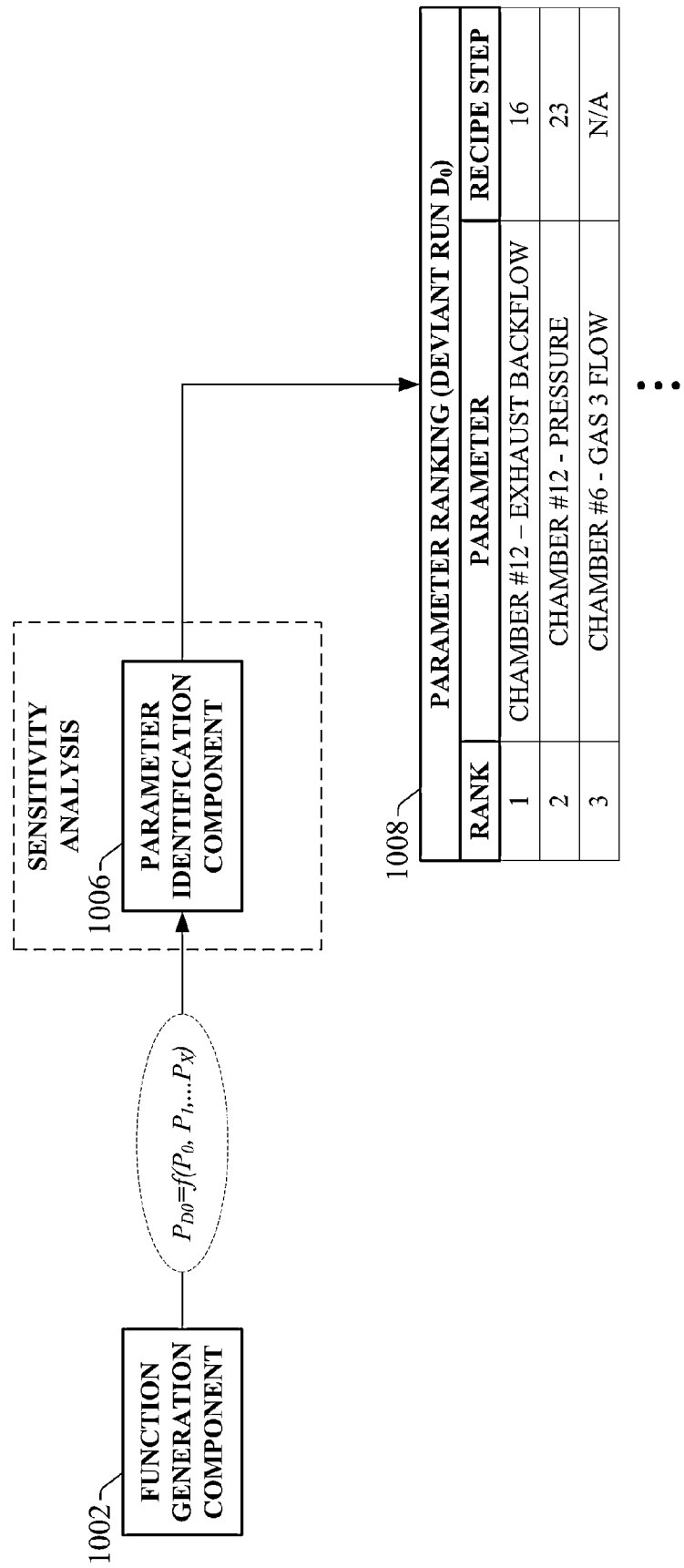
FIG. 10 illustrates ranking of tool parameters based on sensitivity analysis performed on a deviant particle function.

Once contamination functions $P_{D0}$-$P_{Dm}$ have been derived, the parameter identification component can perform sensitivity analysis on each function to identify which tool parameter(s) displayed deviant behavior resulting in the unexpected level of contamination for that run. This deviant behavior represents an unexpected tool parameter event that resulted in a level of wafer contamination outside the expected contamination levels predicted by function $P_{normal}$. In one exemplary technique illustrated in FIG. 10, the deviant tool parameter(s) can be identified based on a comparison of the parameter ranking for normal contamination trends (e.g., parameter ranking 708 of FIG. 7) with a new parameter ranking derived based on sensitivity analysis performed on the deviant particle function (e.g., $P_{D0}$). Function generation component 1002 (similar to function generation components 208, 322, 610, or 702) derives particle contamination function $P_{D0}$ using techniques described above in connection with FIG. 9. That is, function $P_{D0}$ characterizes the particle contamination level of a semiconductor fabrication system based on a data set comprising tool process logs for normal runs $A_0$-$A_n$, plus a tool process log from one deviant run (in this case, deviant run $D_0$). Parameter identification component 1006 (similar to parameter identification components 210, 324, or 706) then performs sensitivity analysis on function $P_{D0}$ to determine a parameter ranking 1008 that ranks the tool parameters based on their determined impact on particle contamination level. Parameter identification component 1006 can determine parameter ranking 1008 using similar techniques to those used to derive parameter ranking 708 for normal contamination trends (e.g., symbolic regression, simulated annealing, etc.).

Once parameter ranking 1008 for the normal runs $A_0$-$A_n$, plus deviant run $D_0$ has been determined, contamination analysis system can examine parameter ranking 1008 to identify a most likely cause of the unexpected contamination event. In one exemplary technique, the contamination analysis system can compare parameter ranking 1008 for the normal runs $A_0$-$A_n$, plus deviant run $D_0$ with parameter ranking 708 derived based solely on the normal runs $A_0$-$A_n$, to determine the change in parameter ranking as a result of adding deviant run $D_0$. For example, if comparison of parameter rankings 708 and 1008 shows that a tool parameter that had been ranked #5 in parameter ranking 708 (that is, the fifth most influential tool parameter affecting normal contamination trends) is now ranked at #1 in parameter ranking 1008 as a result of adding process run data for deviant run $D_0$, contamination analysis system can generate an output suggesting that this tool parameter is a likely root cause of the unexpected level of contamination measured for process run $D_0$. In the present example, parameter ranking 1008 indicates that an exhaust backflow event in chamber #12 during recipe step 16 is a most likely cause of the unexpected contamination level for process run $D_0$.

It is to be appreciated that the tool parameter event ranked at #1 in tool ranking 1008 may not necessarily be the cause of the unexpected contamination level measured for $D_0$. That is, the comparison between parameter rankings 708 and 1008 may show that the tool parameter ranked at #1 in parameter ranking 708 is still ranked at #1 in parameter ranking 1008. However, the comparison may also show that the tool parameter ranked at #5 in parameter ranking 708 for normal contamination function $P_{normal}$ rises to #3 in parameter ranking 1008 for contamination function $P_{D0}$. Accordingly, the contamination analysis system identifies this change and outputs this tool parameter as a likely cause of the unexpected contamination level measured for $D_0$.

Similar sensitivity analysis can be performed on the remaining functions $P_{D1}$-$P_{Dm}$ to determine unexpected tool parameter events associated with each deviant process run $D_0$-$D_m$. Thus, the contamination analysis system identifies a root cause tool parameter event for each unexpected occurrence of particle contamination falling outside the normal systematic contamination trend, and outputs these root cause tool parameter events to a user (e.g., via interface component 204). An exemplary non-limiting display output 1100 listing deviant tool runs together with their respective identified root cause parameter events is illustrated in FIG. 11.

The contamination analysis system can also compare results for the respective deviant process runs $D_0$-$D_m$ to determine if a single unexpected tool parameter event is the root cause of all or a majority of deviant process runs $D_0$-$D_m$. For example, if the parameter ranking comparisons described above identify the same unexpected tool parameter event as the root cause for a significant number of the deviant process runs $D_0$-$D_m$, the contamination analysis system can provide output to a user indicating that the identified tool parameter event is recurring intermittently, and recommending maintenance action to correct the issue.

To provide another dimension of analysis, one or more embodiments of the contamination analysis system can also allow a user to suppress function $P_{normal}$ associated with normal behavior during analysis of deviant runs $D_0$-$D_m$ in order to further isolate the detrimental event. For example, rather than (or in addition to) calculating function $P_{D0}$ based on process logs for normal runs $A_0$-$A_n$ plus the process log for a deviant run, a user may choose to view parameter rankings based only on the process logs for deviant runs $D_0$-$D_m$.

To provide an additional level of granularity with regard to contamination analysis, one or more embodiments of the contamination analysis system described herein can also consider particle contamination location. That is, rather than performing the analyses described above based on total particle contamination counts for each wafer processed by a tool run, some embodiments of the contamination analysis system described herein can accept tool run particle data (e.g., tool run particle data 306) that includes separate particle contamination counts for each of multiple locations on the semiconductor wafer. The contamination analysis system can leverage this more granularized tool run particle data to determine correlations between process parameter events and particle contamination detected at particular locations on the wafer. In one exemplary non-limiting technique, a semiconductor wafer can be divided into multiple sections, and tool run particle data can be measured separately for each section for each process run. The contamination specifications defined by the user (e.g., contamination specifications 312 of FIG. 3) specify the detrimental levels of particles separately for each of the multiple sections. Using the location-specific particle data and contamination specifications, the contamination analysis system can generate separate contamination functions $P_{normal}$ and $P_{D0}$-$P_{Dm}$ for each of the multiple locations. Accordingly, when a process run (e.g., process run $D_7$) yields a wafer having a detrimental level of particle contamination at a particular location on the wafer (e.g., within one of the multiple sections), the contamination analysis system can provide an initial suggestion as to the possible process-induced cause of the contamination based on the normal contamination function $P_{normal}$ and the function $P_{D7}$ calculated for the that section of the wafer.

Figure 12:
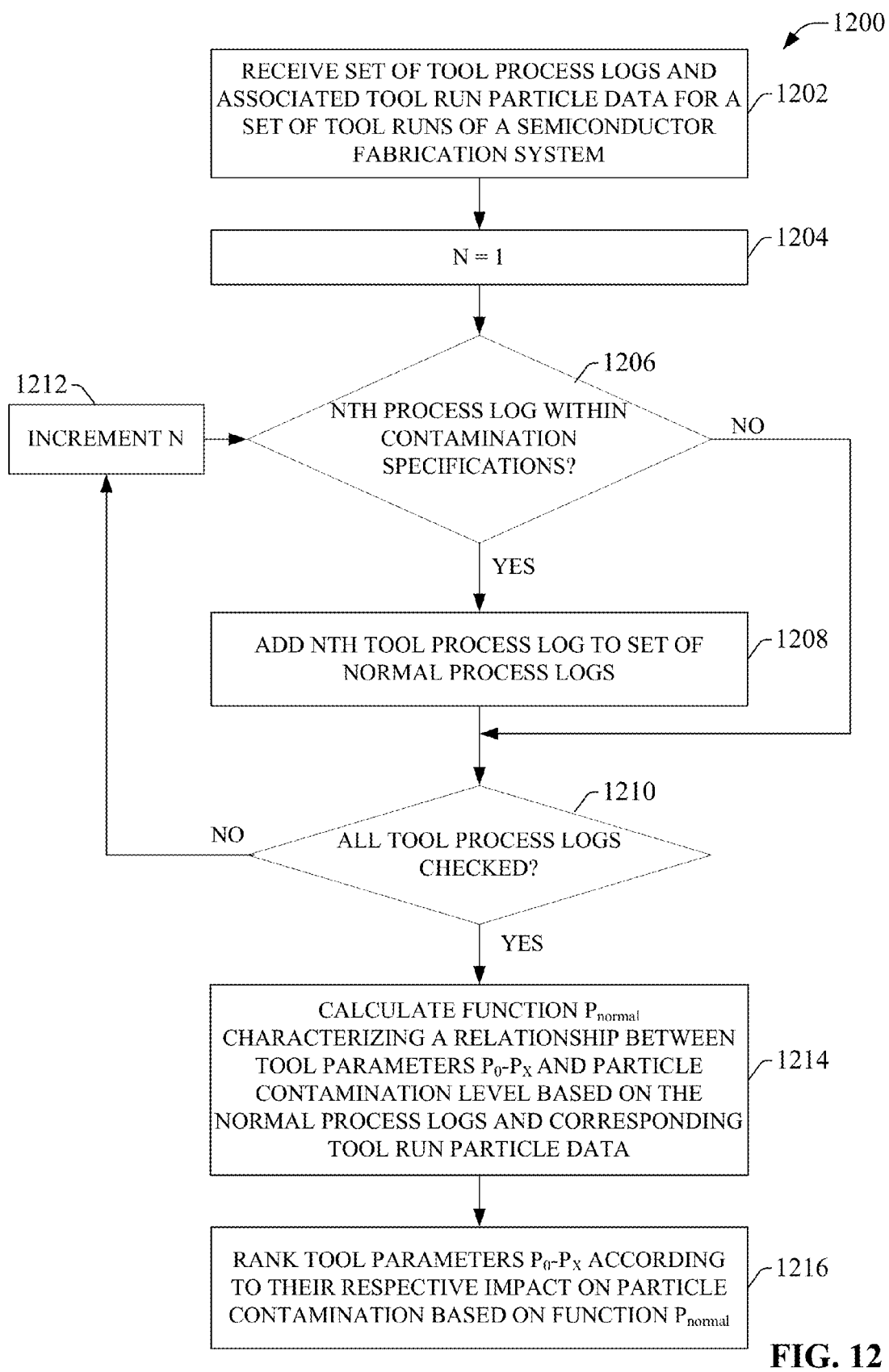
FIG. 12 is a flowchart of an example methodology for identifying tool parameters of a semiconductor fabrication system that affect systematic particle contamination.
Figure 13:
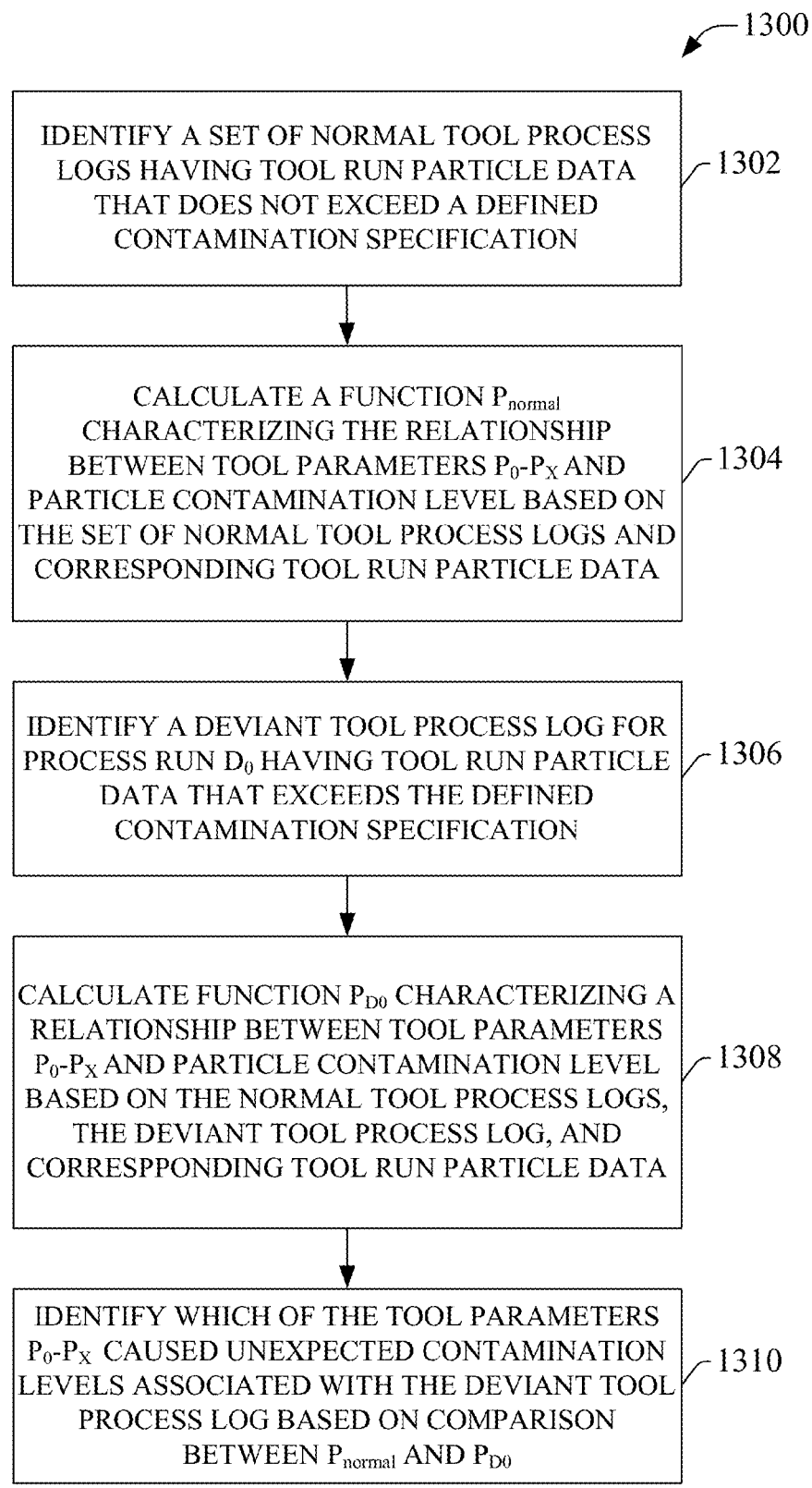
FIG. 13 is a flowchart of an example methodology for isolating unexpected tool parameter behaviors that cause deviant levels of particle contamination.

FIGS. 12-13 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 12 illustrates an example methodology 1200 for identifying tool parameters of a semiconductor fabrication system that affect systematic particle contamination. Initially, at

1202, a set of tool process logs and associated tool run particle data is received for a set of tool runs of a semiconductor fabrication system. The tool process logs can include parameter and performance data measured during respective runs of semiconductor fabrication system. Logged data can include, for example, pressures, temperatures, RF power, usage counts for various tools (e.g., focus rings, mass flow controllers, etc.), time taken to process the wafer for the given process run, chemical and gas consumption, and other such production information. Tool process logs can also include maintenance information, such as time since last performed maintenance, time since last batch of resist was loaded, etc.

At 1204 a counter N is set to 1. At 1206, a determination is made regarding whether the Nth tool process log shows particle count data that is within a set of contamination specifications. Contamination specifications can define one or more upper limits on acceptable levels of particle contamination, specified in terms of particle counts. For example, an exemplary set of contamination specifications can define that wafers having more than 30 medium particles or more than 30 large particles are to be flagged as unacceptable, while wafers having less than 30 medium particles and less than 30 large particles are determined to be within the contamination specifications.

If it is determined at step 1206 that the Nth process log is within contamination specifications, the methodology moves to step 1208, where the Nth tool process log is added to a set of normal process logs. The methodology then moves to step 1210. Alternatively, if it is determined at step 1206 that the Nth process log is not within contamination specifications (e.g., the process log corresponds to tool run particle data that exceeds the acceptable limits defined by the contamination specifications), the process moves directly to step 1210 without adding the Nth tool process log to the set of normal process logs.

At 1210, a determination is made regarding whether all tool process logs in the set have been checked. If it is determined that there are remaining tool process logs that have not been checked, the methodology moves to step 1212, where N is incremented, and steps 1206-1210 are repeated for the next tool process log. Alternatively, if it is determined at step 1210 that all tool process logs have been checked, the methodology moves to step 1214.

At 1214, a function $P_{normal}$ is calculated based on the set of normal tool process logs constructed at steps 1206 and 1208, and the corresponding tool run particle data for the set of normal process logs. Function $P_{normal}$ characterizes the relationship between tool parameters $P_0$-$P_x$ and particle contamination level, and can be derived using any suitable problem solving technique, including but not limited to symbolic regression, simulated annealing, neural networks, least squares fit, or multi-level regression. At 1216, tool parameters $P_0$-$P_x$ are ranked according to their respective impact on normal, systematic particle contamination based on an analysis of contamination function $P_{normal}$. This ranked list of tool parameters can provide guidance regarding where maintenance efforts should be focused in order to mitigate particle contamination during the semiconductor fabrication process.

FIG. 13 illustrates an exemplary methodology 1300 for isolating unexpected tool parameter behaviors that cause deviant levels of particle contamination. Initially, at 1302, a set of normal tool process logs generated for a semiconductor fabrication process are identified, where the normal tool process logs are those having tool run particle data that does not exceed a defined contamination specification. At 1304, a function $P_{normal}$ is calculated based on the set of normal tool process logs identified at step 1302 and corresponding tool run particle data for the normal tool process logs, where $P_{normal}$ characterizes the relationship between tool parameters $P_0$-$P_x$ and particle contamination level. At 1306, a deviant tool processing log is identified having tool run particle data that exceeds the defined contamination specification, the deviant tool processing log corresponding to a deviant process run $D_0$.

At 1308, a function $P_{D0}$ is calculated characterizing the relationship between tool parameters $P_0$-$P_x$ and particle contamination level. In contrast to function $P_{normal}$, function $P_{D0}$ is derived based on the normal process logs plus the deviant tool process log for deviant process run $D_0$, as well as corresponding tool run particle data for the normal process logs and the deviant process log. At 1310, one or more of the tool parameters $P_0$-$P_x$ are identified as the cause of unexpected contamination levels measured for deviant process run $D_0$ based on a comparison between functions $P_{normal}$ and $P_{D0}$. In one exemplary comparison technique, tool parameters $P_0$-$P_x$ can be ranked according to their relative impact on particle contamination based on analysis of function $P_{normal}$, and a similar ranking of tool parameters $P_0$-$P_x$ can be derived based on function $P_{D0}$. A comparison of the two rankings may reveal that a particular tool parameter is ranked higher in the $P_{D0}$ ranking than in the $P_{normal}$ ranking, suggesting that an event associated with the identified tool parameter caused the deviant contamination level measured for process run $D_0$.

The various aspects (e.g., in connection with receiving one or more selections, determining the meaning of the one or more selections, distinguishing a selection from other actions, implementation of selections to satisfy the request, and so forth) can employ various artificial intelligence-based schemes for carrying out various aspects thereof. For example, a process for determining if a particular action is a request for an action to be performed or a general action (e.g., an action that the user desires to perform manually) can be enabled through an automatic classifier system and process.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. In the case of selections, for example, attributes can be identification of a focus chamber and/or a reference chamber and the classes are criteria of the focus chamber and/or reference chamber that need to be utilized to satisfy the request.

A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, for example, naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

As will be readily appreciated from the subject specification, the one or more aspects can employ classifiers that are explicitly trained (e.g., through a generic training data) as well as implicitly trained (e.g., by observing user behavior, receiving extrinsic information). For example, SVM's are configured through a learning or training phase within a classifier constructor and feature selection module. Thus, the classifier(s) can be used to automatically learn and perform a number of functions, including but not limited to determining according to a predetermined criteria when to compare chambers, which chambers to compare, what chambers to group together, relationships between chambers, and so forth. The criteria can include, but is not limited to, similar requests, historical information, and so forth.

Figure 14:
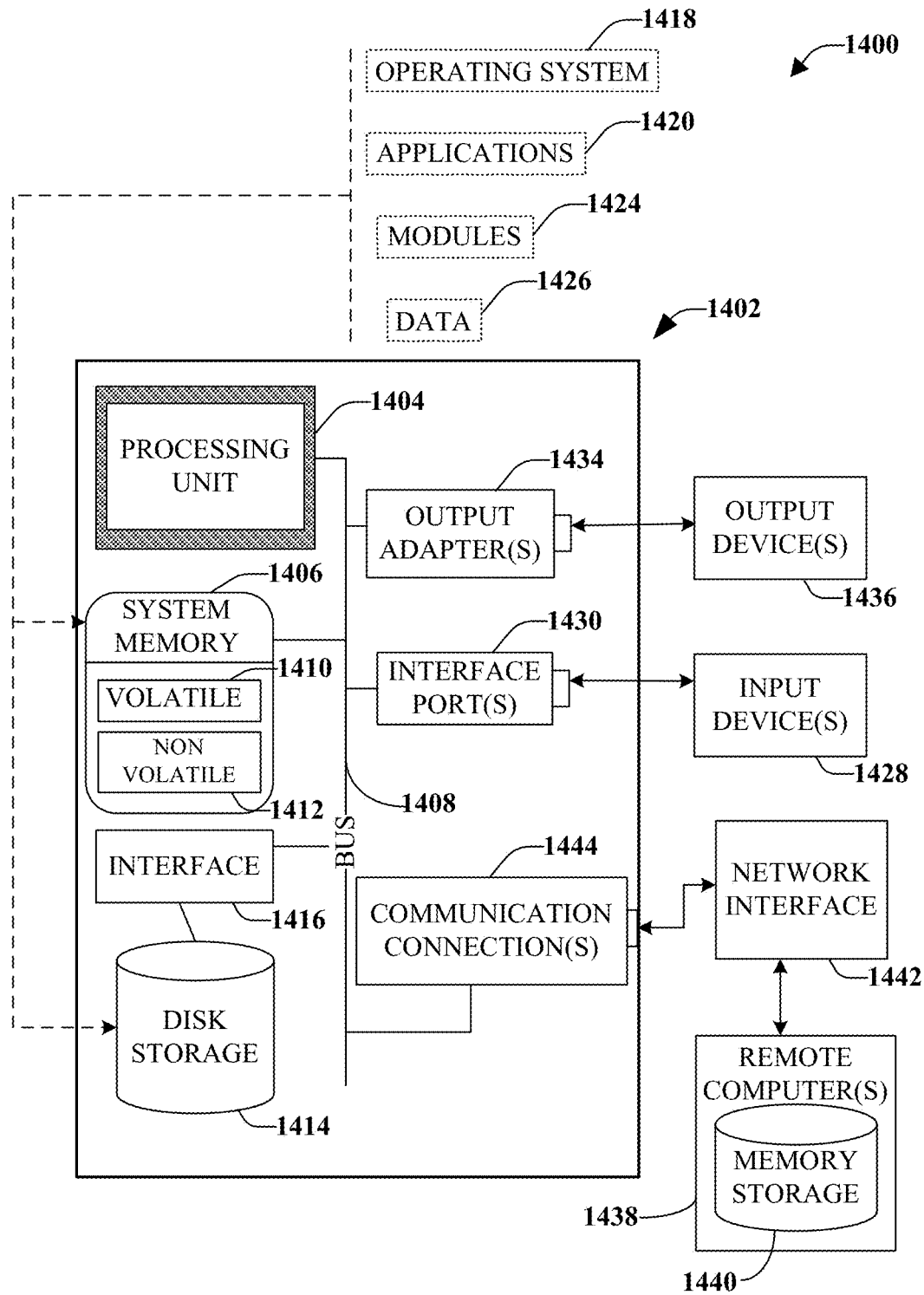
FIG. 14 is an example computing environment.

Referring now to FIG. 14, illustrated is a block diagram of a computer operable to execute the disclosed aspects. In order to provide additional context for various aspects thereof, FIG. 14 and the following discussion are intended to provide a brief, general description of a suitable computing environment 1400 in which the various aspects of the embodiment(s) can be implemented. While the description above is in the general context of computer-executable instructions that may run on one or more computers, those skilled in the art will recognize that the various embodiments can be implemented in combination with other program modules and/or as a combination of hardware and software.

Generally, program modules include routines, programs, components, data structures, etc., that perform particular tasks or implement particular abstract data types. Moreover, those skilled in the art will appreciate that the disclosed aspects can be practiced with other computer system configurations, including single-processor or multiprocessor computer systems, minicomputers, mainframe computers, as well as personal computers, hand-held computing devices, microprocessor-based or programmable consumer electronics, micro-controllers, embedded controllers, multi-core processors, and the like, each of which can be operatively coupled to one or more associated devices.

The illustrated aspects of the various embodiments may also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, DRAM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules, or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, microwave, RF, infrared and other wireless methods (e.g., IEEE 802.12X, IEEE 802.15.4).

With reference again to FIG. 14, the illustrative computing environment 1400 for implementing various aspects includes a computer 1402, which includes a processing unit 1404, a system memory 1406 and a system bus 1408. The system bus 1408 couples system components including, but not limited to, the system memory 1406 to the processing unit 1404. The processing unit 1404 can be any of various commercially available processors. Dual microprocessors and other multi-processor architectures may also be employed as the processing unit 1404.

The system bus 1408 can be any of several types of bus structure that may further interconnect to a memory bus (with or without a memory controller), a peripheral bus, and a local bus using any of a variety of commercially available bus architectures. The system memory 1406 includes read-only memory (ROM) 1410 and random access memory (RAM) 1412. A basic input/output system (BIOS) is stored in a non-volatile memory 1410 such as ROM, EPROM, EEPROM, which BIOS contains the basic routines that help to transfer information between elements within the computer 1402, such as during start-up. The RAM 1412 can also include a high-speed RAM such as static RAM for caching data.

The computer 1402 further includes a disk storage 1414, which can include an internal hard disk drive (HDD) (e.g., EIDE, SATA), which internal hard disk drive may also be configured for external use in a suitable chassis (not shown), a magnetic floppy disk drive (FDD), (e.g., to read from or write to a removable diskette) and an optical disk drive (e.g., reading a CD-ROM disk or, to read from or write to other high capacity optical media such as the DVD). The hard disk drive, magnetic disk drive and optical disk drive can be connected to the system bus 1408 by a hard disk drive interface, a magnetic disk drive interface and an optical drive interface, respectively. The interface 1416 for external drive implementations includes at least one or both of Universal Serial Bus (USB) and IEEE 1094 interface technologies. Other external drive connection technologies are within contemplation of the various embodiments described herein.

The drives and their associated computer-readable media provide nonvolatile storage of data, data structures, computer-executable instructions, and so forth. For the computer 1402, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the illustrative operating environment, and further, that any such media may contain computer-executable instructions for performing the disclosed aspects.

A number of program modules can be stored in the drives and RAM, including an operating system 1418, one or more application programs 1420, other program modules 1424, and program data 1426. All or portions of the operating system, applications, modules, and/or data can also be cached in the RAM. It is to be appreciated that the various embodiments can be implemented with various commercially available operating systems or combinations of operating systems.

A user can enter commands and information into the computer 1402 through one or more wired/wireless input devices 1428, such as a keyboard and a pointing device, such as a mouse. Other input devices (not shown) may include a microphone, an IR remote control, a joystick, a game pad, a stylus pen, touch screen, or the like. These and other input devices are often connected to the processing unit 1404 through an input device (interface) port 1430 that is coupled to the system bus 1408, but can be connected by other interfaces, such as a parallel port, an IEEE 1094 serial port, a game port, a USB port, an IR interface, etc.

A monitor or other type of display device is also connected to the system bus 1408 via an output (adapter) port 1434, such as a video adapter. In addition to the monitor, a computer typically includes other peripheral output devices 1436, such as speakers, printers, etc.

The computer 1402 may operate in a networked environment using logical connections via wired and/or wireless communications to one or more remote computers, such as a remote computer(s) 1438. The remote computer(s) 1438 can be a workstation, a server computer, a router, a personal computer, portable computer, microprocessor-based entertainment appliance, a peer device or other common network node, and typically includes many or all of the elements described relative to the computer 1402, although, for purposes of brevity, only a memory/storage device 1440 is illustrated.

The remote computer(s) can have a network interface 1442 that enables logical connections to computer 1402. The logical connections include wired/wireless connectivity to a local area network (LAN) and/or larger networks, e.g., a wide area network (WAN). Such LAN and WAN networking environments are commonplace in offices and companies, and facilitate enterprise-wide computer networks, such as intranets, all of which may connect to a global communications network, e.g., the Internet.

When used in a LAN networking environment, the computer 1402 is connected to the local network through a wired and/or wireless communication network interface or adapter (communication connection(s)) 1444. The adaptor 1444 may facilitate wired or wireless communication to the LAN, which may also include a wireless access point disposed thereon for communicating with the wireless adaptor.

When used in a WAN networking environment, the computer 1402 can include a modem, or is connected to a communications server on the WAN, or has other means for establishing communications over the WAN, such as by way of the Internet. The modem, which can be internal or external and a wired or wireless device, is connected to the system bus 1408 via the serial port interface. In a networked environment, program modules depicted relative to the computer 1402, or portions thereof, can be stored in the remote memory/storage device 1440. It will be appreciated that the network connections shown are illustrative and other means of establishing a communications link between the computers can be used.

The computer 1402 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, and so forth), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11x (a, b, g, etc.) to provide secure, reliable, fast wireless connectivity. A Wi-Fi network can be used to connect computers to each other, to the Internet, and to wired networks (which use IEEE 802.3 or Ethernet).

Wi-Fi networks can operate in the unlicensed 2.4 and 5 GHz radio bands. IEEE 802.11 applies to generally to wireless LANs and provides 1 or 2 Mbps transmission in the 2.4 GHz band using either frequency hopping spread spectrum (FHSS) or direct sequence spread spectrum (DSSS). IEEE 802.11a is an extension to IEEE 802.11 that applies to wireless LANs and provides up to 54 Mbps in the 5 GHz band. IEEE 802.11a uses an orthogonal frequency division multiplexing (OFDM) encoding scheme rather than FHSS or DSSS. IEEE 802.11b (also referred to as 802.11 High Rate DSSS or Wi-Fi) is an extension to 802.11 that applies to wireless LANs and provides 11 Mbps transmission (with a fallback to 5.5, 2 and 1 Mbps) in the 2.4 GHz band. IEEE 802.11g applies to wireless LANs and provides 20+Mbps in the 2.4 GHz band. Products can contain more than one band (e.g., dual band), so the networks can provide real-world performance similar to the basic 10BaseT wired Ethernet networks used in many offices.

Figure 15:
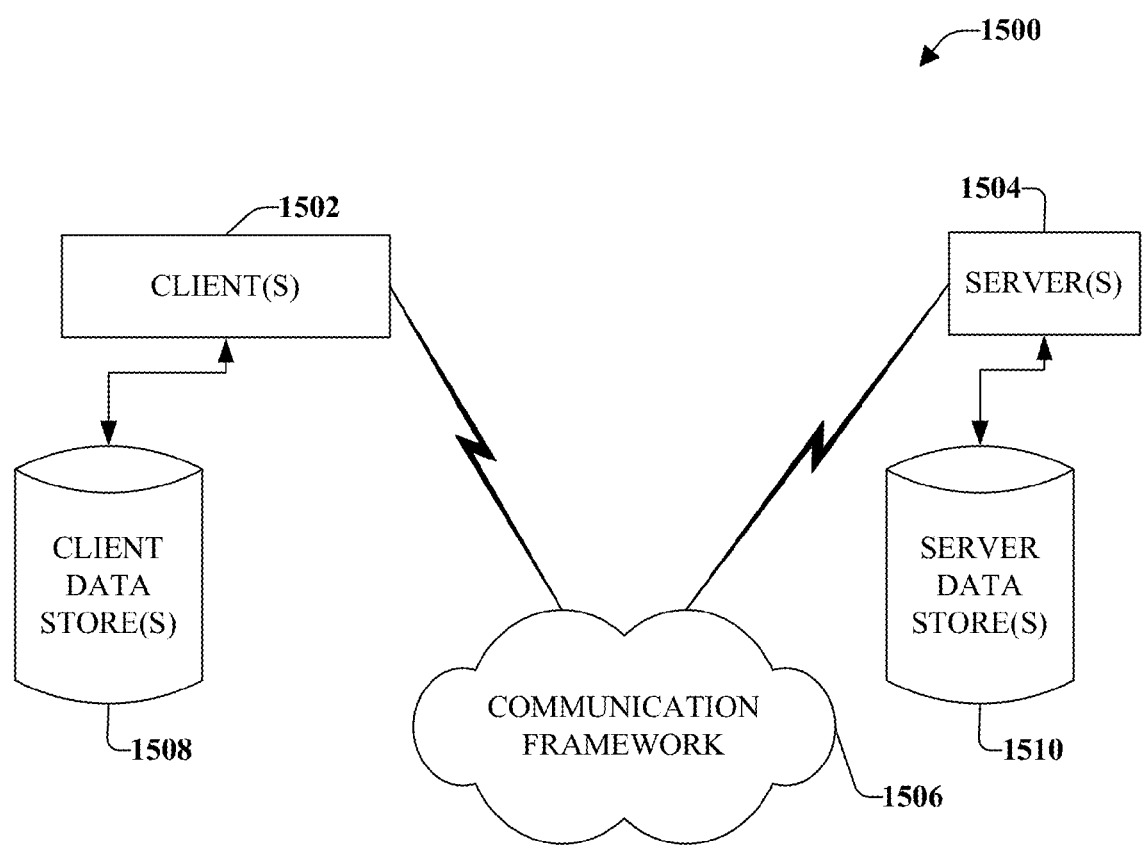
FIG. 15 is an example networking environment.

Referring now to FIG. 15, there is illustrated a schematic block diagram of an illustrative computing environment 1500 for processing the disclosed architecture in accordance with another aspect. The computing environment 1500 includes one or more client(s) 1502. The client(s) 1502 can be hardware and/or software (e.g., threads, processes, computing devices). The client(s) 1502 can house cookie(s) and/or associated contextual information in connection with the various embodiments, for example.

The environment 1500 also includes one or more server(s) 1504. The server(s) 1504 can also be hardware and/or software (e.g., threads, processes, computing devices). The servers 1504 can house threads to perform transformations in connection with the various embodiments, for example. One possible communication between a client 1502 and servers 1504 can be in the form of a data packet adapted to be transmitted between two or more computer processes. The data packet may include a cookie and/or associated contextual information, for example. The environment 1500 includes a communication framework 1506 (e.g., a global communication network such as the Internet) that can be employed to facilitate communications between the client(s) 1502 and the server(s) 1504.

Communications can be facilitated via a wired (including optical fiber) and/or wireless technology. The client(s) 1502 are operatively connected to one or more client data store(s) 1508 that can be employed to store information local to the client(s) 1502 (e.g., cookie(s) and/or associated contextual information). Similarly, the server(s) 1504 are operatively connected to one or more server data store(s) 1510 that can be employed to store information local to the servers 1504.

In addition to the various embodiments described herein, it is to be understood that other similar embodiments can be used or modifications and additions can be made to the described embodiment(s) for performing the same or equivalent function of the corresponding embodiment(s) without deviating there from. Still further, multiple processing chips or multiple devices can share the performance of one or more functions described herein, and similarly, storage can be effected across a plurality of devices. Accordingly, the invention should not be limited to any single embodiment, but rather should be construed in breadth, spirit and scope in accordance with the appended claims.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used, for the avoidance of doubt, such terms are intended to be inclusive in a manner similar to the term "comprising" as an open transition word without precluding any additional or other elements.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it can be noted that one or more components may be combined into a single component providing aggregate functionality or divided into several separate sub-components, and that any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described above, methodologies that may be implemented in accordance with the described subject matter can also be appreciated with reference to the flowcharts of the various figures. While for purposes of simplicity of explanation, the methodologies are shown and described as a series of blocks, it is to be understood and appreciated that the various embodiments are not limited by the order of the blocks, as some blocks may occur in different orders and/or concurrently with other blocks from what is depicted and described herein. Where non-sequential, or branched, flow is illustrated via a flowchart, it can be appreciated that various other branches, flow paths, and orders of the blocks, may be implemented which achieve the same or a similar result. Moreover, not all illustrated blocks may be required to implement the methodologies described herein.

What is claimed is:

1. A system, comprising:
at least one non-transitory computer-readable medium having stored therein computer-executable components; and
at least one processor that executes the following computer-executable components stored on the at least one non-transitory computer readable medium:
a function generation component configured to derive a normal contamination function that characterizes systematic particle contamination from a semiconductor fabrication system as a function of a plurality of tool parameters of tools of the semiconductor fabrication system based on analysis of respective normal tool process logs associated with runs of at least one semiconductor material process on the semiconductor fabrication system producing the systematic particle contamination being within a contamination specification for the at least one semiconductor material process, wherein the normal tool process logs are from a set of tool process logs associated with the runs of the at least one semiconductor material process, and each tool process log comprises values for the tool parameters for an associated run of the at least one semiconductor material process;
a parameter identification component configured to identify at least one of the plurality of tool parameters as a cause of the systematic particle contamination based on analysis of the normal contamination function; and
an interface component configured to display the identified at least one tool parameter to provide guidance as to where maintenance efforts should be focused in order to control contamination levels while minimizing maintenance downtime.

2. The system of claim 1, wherein the parameter identification component is further configured to rank at least a subset of the plurality of tool parameters according to their relative effect on the systematic particle contamination based on the analysis of the normal contamination function.

3. The system of claim 1, further comprising a separation component configured to separate the tool process logs into the normal tool process logs and deviant tool process logs associated with other runs of the set of runs of the at least one semiconductor material process producing the systematic particle contamination not being within the contamination specification.

4. The system of claim 3, wherein the function generation component is further configured to derive a contamination function that characterizes the systematic particle contamination as a second function of the plurality of tool parameters based on analysis of the normal tool process logs and one deviant tool process log of the deviant tool process logs.

5. The system of claim 4, wherein the parameter identification component is further configured to identify one of the plurality of tool parameters as a cause of the systematic particle contamination not being within the contamination specification associated with the one deviant tool process log based on a comparison between the normal contamination function and the contamination function.

6. The system of claim of claim 5, wherein the parameter identification component is further configured to identify the one of the plurality of tool parameters based on a comparison between a first ranking of the plurality of tool parameters associated with the normal contamination function and a second ranking of the plurality of tool parameters associated with the contamination function, and wherein the first ranking ranks the plurality of tool parameters according to their relative effect on the systematic particle contamination according to a first sensitivity analysis of the normal contamination function and the second ranking ranks the plurality of tool parameters according to their relative effect on the systematic particle contamination according to a second sensitivity analysis of the contamination function.

7. The system of claim 3, further comprising an interface component configured to receive configuration information that defines the contamination specification in terms of one or more upper limits on particle counts.

8. The system of claim 3, wherein the configuration input includes selection of one or more metrologies associated with the one or more upper limits, the one or more metrologies including at least one of a first count of particles of a first type, a second count of particles of a second type, a third count of particles of a third type, or a fourth count of particles of the first type, the second type, and the third type.

9. The system of claim 1, wherein the plurality of tool parameters is obtained from spectroscopy measuring spectral intensity during processing and process log data including at least one of pressure data, temperature data, or power data, and tool maintenance data including at least one of a time since a last performed maintenance, a time since a last batch of resist was loaded, age of one or more tool parts, an elapsed time to process a wafer, chemical consumption data, or gas consumption data.

10. A method, comprising:
generating, by a system including a processor, a normal contamination function defining particle contamination from a semiconductor fabrication system as a function of multiple tool parameters of tools of the semiconductor fabrication system based on analysis of respective normal tool process logs generated for runs of semiconductor fabrication system producing the particle contamination within a contamination specification for the semiconductor fabrication system, wherein the normal tool process logs are from a set of tool process logs associated with the runs of the semiconductor fabrication system, and each tool process log comprises values for the tool parameters for an associated run of the semiconductor fabrication system;
identifying, by the system, at least one of the tool parameters as a cause of the particle contamination based on analysis of the normal contamination function; and
displaying, by the system, the identified at least one tool parameter to provide guidance as to where maintenance efforts should be focused in order to control contamination levels while minimizing maintenance downtime.

11. The method of claim 10, further comprising ranking at least a subset of the multiple tool parameters in order of their respective influence on the particle contamination based on the analysis of the normal contamination function.

12. The method of claim 10, further comprising:
receiving the set of tool process logs generated for the semiconductor fabrication system; and
dividing the set of tool process logs into the normal tool process logs and deviant tool process logs associated with other runs of the set of runs of the semiconductor fabrication system producing the particle contamination not within the contamination specification.

13. The method of claim 12, further comprising generating a contamination function defining the particle contamination from the semiconductor fabrication system as a function of the multiple tool parameters based on analysis of a data set comprising the normal tool process logs and one deviant tool process log selected from the deviant tool process logs.

14. The method of claim 13, further comprising:
comparing the normal contamination function with the contamination function; and
identifying one of the multiple tool parameters as causing the particle contamination associated with the one deviant tool process log to not be within the contamination specification based on a result of the comparing.

15. The method of claim 14, wherein the identifying the one of the multiple tool parameters comprises:
ranking the multiple tool parameters in order of their respective influence on the normal contamination function to yield a first ranking;
ranking the multiple tool parameters in order of their respective influence on the contamination function to yield a second ranking; and
identifying the one of the multiple tool parameters based on a comparison between the first ranking and the second ranking.

16. The method of claim 10, further comprising defining the contamination specification as upper limits on particle counts for respective particle metrologies.

17. A non-transitory computer-readable medium having stored thereon computer-executable instructions that, in response to execution by a system including a processor, cause the system to perform operations comprising:
generating a normal contamination function defining particle contamination from a semiconductor fabrication system as a function of tool parameters of tools of the semiconductor fabrication system based on analysis of respective normal tool process logs associated with runs of the semiconductor fabrication system producing the particle contamination being within a contamination specification for the semiconductor fabrication system, wherein the normal tool process logs are from a set of tool process logs associated with the runs of the semiconductor fabrication system, and each tool process log comprises values for the tool parameters for an associated run of the semiconductor fabrication system;
identifying at least one parameter of the tool parameters as a cause of the particle contamination based on the normal contamination function; and
displaying the identified at least one tool parameter to provide guidance as to where maintenance efforts should be focused in order to control contamination levels while minimizing maintenance downtime.

18. The non-transitory computer-readable medium of claim 17, the operations further comprising:
ranking the tool parameters according to their relative influence on the particle contamination.

19. The non-transitory computer-readable medium of claim 17, the operations further comprising:
organizing the set of tool process logs into the normal tool process logs and deviant tool process logs associated with other runs of the set of runs of the semiconductor fabrication system producing the particle contamination that are not within the contamination specification.

20. The non-transitory computer-readable medium of claim 17, wherein a tool process log of the set of tool process logs comprises performance data measured during a run of the semiconductor fabrication system and maintenance information associated with the semiconductor fabrication system.

* * * * *